US007183647B2

(12) United States Patent
Murayama et al.

(10) Patent No.: US 7,183,647 B2
(45) Date of Patent: Feb. 27, 2007

(54) WIRING SUBSTRATE AND ELECTRONIC PARTS PACKAGING STRUCTURE

(75) Inventors: Kei Murayama, Nagano (JP); Masahiro Sunohara, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 127 days.

(21) Appl. No.: 10/709,096

(22) Filed: Apr. 13, 2004

(65) Prior Publication Data

US 2004/0212087 A1   Oct. 28, 2004

(30) Foreign Application Priority Data

Apr. 24, 2003   (JP) ............... 2003-120499

(51) Int. Cl.
 *H01L 23/48* (2006.01)
(52) U.S. Cl. ............... 257/738; 257/778; 257/733; 257/689; 257/737; 257/779; 257/780; 257/723; 257/678; 257/700
(58) Field of Classification Search ............... 257/738, 257/778, 733, 689, 737, 779, 780, 678, 700 257/723
See application file for complete search history.

(56) References Cited

U.S. PATENT DOCUMENTS

| 5,677,575 | A | 10/1997 | Maeta et al. | |
|---|---|---|---|---|
| 5,736,791 | A | 4/1998 | Fujiki et al. | |
| 6,041,495 | A | 3/2000 | Yoon et al. | |
| 6,326,561 | B1 * | 12/2001 | Watanabe et al. | ............ 174/264 |
| 6,399,897 | B1 * | 6/2002 | Umematsu et al. | ......... 174/261 |
| 6,543,131 | B1 | 4/2003 | Beroz et al. | |
| 6,590,287 | B2 * | 7/2003 | Ohuchi | ...................... 257/738 |
| 6,798,072 | B2 * | 9/2004 | Kajiwara et al. | ........... 257/778 |
| 2001/0023782 | A1 | 9/2001 | Nakamura | |
| 2003/0001286 | A1 | 1/2003 | Kajiwara et al. | |
| 2003/0127747 | A1 | 7/2003 | Kajiwara et al. | |

FOREIGN PATENT DOCUMENTS

| EP | 0 883 330 A1 | 12/1998 |
|---|---|---|
| EP | 1 361 612 A2 | 11/2003 |
| JP | 2002009444 A * | 1/2002 |
| JP | 2002-198461 | 7/2002 |

OTHER PUBLICATIONS

"Via Rich Thin Film Wiring Scheme for Electronic Packaging", IBM Technical Disclosure Bulletin, IBM Corp. New York, US, vol. 34, No. 12, May 1, 1992, pp. 85-86.
"Improved Joint Strength, Reliability and Cost", IBM Technical Disclosure Bulletin, IBM Corp., New York, US, vol. 36, No. 10, Oct. 1, 1993, p. 275.

* cited by examiner

*Primary Examiner*—Douglas W. Owens
*Assistant Examiner*—Junghwa Im
(74) *Attorney, Agent, or Firm*—Armstrong, Kratz, Quintos, Hanson & Brooks, LLP

(57) ABSTRACT

In a wiring substrate of the present invention in which a bump of an electronic parts is bonded to a connection pad of a wiring pattern provided on an insulating film by an ultrasonic flip-chip packaging, a via hole into which a via post acting as a strut to support the connection pad upon the ultrasonic flip-chip packaging is filled is arranged in the insulating film under the connection pad.

6 Claims, 4 Drawing Sheets oscillation direction of the ultrasonic wave

WIRING SUBSTRATE AND ELECTRONIC PARTS PACKAGING STRUCTURE

BACKGROUND OF THE INVENTION

1. Field of the Invention

The present invention relates to a wiring substrate and an electronic parts packaging structure and, more particularly, a wiring substrate on which electronic parts are packaged by an ultrasonic flip-chip packaging and an electronic parts packaging structure in which the electronic parts are packaged on the wiring substrate.

2. Description of the Related Art

In the related art, a wide variety of packaging methods are proposed as the flip-chip packaging that is being quickly spread as the representative high-density packaging method. As one of the flip-chip packaging method, there is the ultrasonic flip-chip packaging method.

In the ultrasonic flip-chip packaging method, as shown in FIG. 1A, first an electronic parts 106 having bumps 108 thereon and a wiring substrate 100 having connection pads 104 on an insulating film 102 are prepared. Then, the bumps 108 on the electronic parts 106 picked up by the ultrasonic tool are arranged so as to oppose to upper surfaces of the connection pads 104 of the wiring substrate 100. Then, the bumps 108 on the electronic parts 106 are bonded to the connection pads 104 of the wiring substrate 100 by applying the ultrasonic vibration in parallel with the surface of the wiring substrate 100 in a state that the pressure is applied to the electronic parts 106.

Meanwhile, in many cases the resin is used as the insulating film 102 of the wiring substrate 100. As shown in FIG. 1B, since the insulating film 102 made of resin is relatively soft, sometimes the connection pads 104 are pushed into the underlying insulating film 102 by the pressure or the ultrasonic vibration applied when the ultrasonic flip-chip packaging is carried out, and are deformed. Therefore, since an energy of the ultrasonic vibration is not sufficiently transmitted as the energy to bond the bumps 108 on the electronic parts 106 and the connection pads 104 of the wiring substrate 100, such a problem exists that it becomes difficult to bond the bumps 108 and the connection pads 104 with good reliability.

Also, in the ultrasonic flip-chip packaging, the ultrasonic vibration has such a characteristic that its energy is ready to transfer to the center portion of the electronic parts 106 rather than both end portions. Therefore, the bonding characteristic of the bump 108 and the connection pad 104 is varied between the center portion and both end portions of the electronic parts 106, and thus reliability of the bonding is lowered in some cases.

SUMMARY OF THE INVENTION

It is an object of the present invention to provide a wiring substrate capable of packaging electronic parts by an ultrasonic flip-chip packaging not to cause any problem, and an electronic parts packaging structure in which the electronic parts are packaged on the wiring substrate.

The present invention is associated with a wiring substrate in which a bump of an electronic parts is bonded to a connection pad of the wiring substrate, which has a structure in which a wiring pattern including the connection pad is provided on an insulating film, by an ultrasonic flip-chip packaging, wherein a via hole into which a via post acting as a strut to support the connection pad upon the ultrasonic flip-chip packaging is filled is arranged in the insulating film under the connection pad.

As described above, in the case that the insulating film of the wiring substrate is made of soft resin, the connection pad eats into the insulating film and is deformed readily when the bump of the electronic parts is bonded to the connection pad on the wiring substrate by the ultrasonic flip-chip packaging. Therefore, since the energy of the ultrasonic vibration is not effectively transferred as the bonding energy, the flip-chip bonding of high reliability cannot be achieved.

In the present invention, the via holes in which the via post is filled are arranged under the connection pads that are pushed by the bumps of the electronic parts upon the ultrasonic flip-chip packaging. Therefore, since the via posts under the connection pads function as the strut, intrusion of the connection pads into the insulating film can be prevented even if the connection pads are pushed against the underlying insulating film side upon the ultrasonic flip-chip packaging.

Therefore, since the ultrasonic vibration can be transferred effectively as the energy used to bond the bumps of the electronic parts and the connection pads of the wiring substrate, the electronic parts can be connected to the wiring substrate with good reliability.

Alternately, in place of arrangement of the via holes under the connection pads, the similar via holes may be arranged under the wiring patterns that are connected to the connection pads in the position within 200 μm from the connection pad. In this case, similarly intrusion of the connection pads into the insulating film can be prevented and the bumps of the electronic parts can be connected to the connection pads on the wiring substrate with good reliability.

In this case, In Patent Application Publication (KOKAI) 2002-198461 (Patent Literature 1), the structure in which the via holes 17 are formed in portions of the core substrate 13, which correspond to the external connection terminal pads 16 on which the solder ball 15 is mounted in the plastic package, and then the solder resist film 14 is filled in the via hole 17 is set forth. However, the bumps of the electronic parts are not bonded to the external connection terminal pads 16 in Patent Literature 1, and also the solder resist film 14 filled in the via hole 17 does not function as the strut. As a result, Patent Literature 1 does not suggest the present invention at all.

In one preferred mode of the above present invention, the via hole is a dummy via hole and a normal via hole may be arranged separately under a predetermined portion of the wiring pattern connected to the connection pad. Also, the wiring substrate has a plurality of connection pads, a plurality of via holes associated with the plurality of connection pads are arranged in a state that a dummy via hole and normal via holes are arranged mixedly, and a normal via hole is arranged separately under a predetermined portion of the wiring pattern connected to the connection pad, in the wiring pattern in which the dummy via hole is arranged under the connection pad or the wiring pattern.

That is, if the normal via hole is arranged in a position that is away from the connection pad in excess of 200 μm by the design rule, such normal via hole does not sufficiently function as the strut to prevent the intrusion of the connection pad into the insulating film, and thus it is possible that the connection pad eats into the insulating film. Therefore, the dummy via hole is arrange separately from the normal via hole as the strut under the connection pad or the wiring pattern in a position within 200 μm from the connection pad.

Also, in one preferred mode of the above present invention, the wiring substrate has a plurality of connection pads corresponding to a plurality of bumps of the electronic parts, and a plurality of via holes associated with the plurality of connection pads, and a diameter of the via holes formed in portions corresponding to both end portions of the electronic parts is set larger than a diameter of the via hole formed in a portion corresponding to a center portion of the electronic parts, in an oscillation direction of an ultrasonic wave applied when the electronic parts is packaged onto the wiring substrate by the ultrasonic flip-chip packaging.

Since the ultrasonic vibration tends to transfer largely to the center portion of the electronic parts rather than both end portions, the bonding characteristic is varied between the center portion and both end portions of the electronic parts and thus the bonding of high reliability cannot be performed. In one preferred mode of the wiring substrate of the above present invention, the diameter of the via holes corresponding to both end portions of the electronic parts is set larger than the diameter of the via hole corresponding to the center portion of the electronic parts. Therefore, the connection pads connected to the bumps at both end portions of the electronic parts have a larger withstanding force against the pressure or the ultrasonic vibration applied by the ultrasonic flip-chip packaging than the connection pad at the center portion.

Therefore, since the ultrasonic vibration can be transferred sufficiently to both end portions of the electronic parts upon the ultrasonic flip-chip packaging, the energy of the ultrasonic vibration can be transferred uniformly to the overall electronic parts. As a result, since the bumps of the electronic parts can be bonded to the connection pads of the wiring substrate with good reliability as a whole, yield of production of the electronic parts packaging structure in which the electronic parts are packaged onto the wiring substrate 1a can be improved.

DETAILED DESCRIPTION OF THE PREFERRED EMBODIMENTS

Embodiments of the present invention will be explained with reference to the accompanying drawings hereinafter.

(First Embodiments)

Figure 1A:
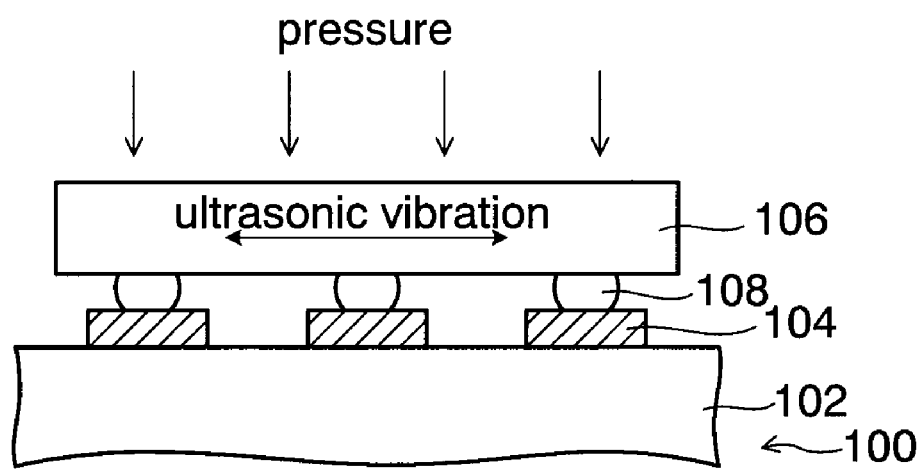
FIGS. 1A and 1B are sectional views showing the problem caused when electronic parts are packaged on a wiring substrate by an ultrasonic flip-chip packaging in the related art.
Figure 1B:
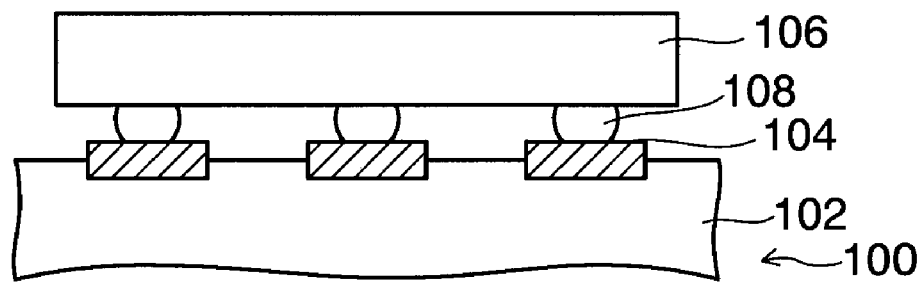
Figure 2:
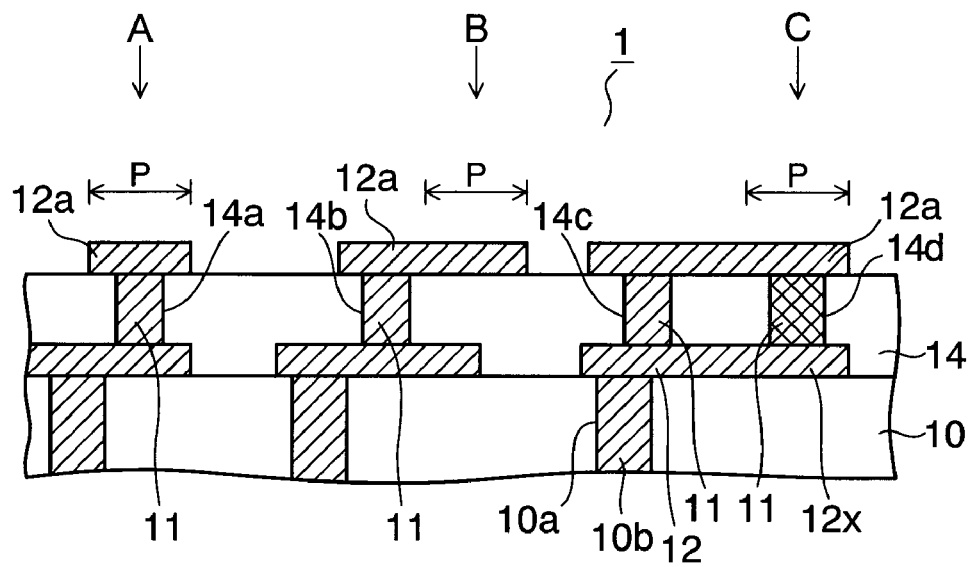
FIG. 2 is a sectional view showing a wiring substrate of a first embodiment of the present invention.

FIG. 2 is a sectional view showing a wiring substrate of a first embodiment of the present invention. In a wiring substrate 1 in the first embodiment of the present invention, through holes 10a are provided in an insulating base substrate 10, and a through electrode 10b is filled in the through hole 10a. Then, first wiring patterns 12 connected to the through electrode 10b respectively are formed on the base substrate 10.

An interlayer insulating film 14 made of resin is formed on the base substrate 10 and the first wiring patterns 12. Also, via holes 14a to 14d are formed in predetermined portions of the interlayer insulating film 14 on the first wiring patterns 12, and a via post 11 is filed in the via holes 14a to 14d respectively. In addition, second wiring patterns 12a connected to the via post 11 respectively are formed on the interlayer insulating film 14. The first and second wiring patterns 12, 12a, the through electrode 10b, and the via post 11 is made of metal such as copper (Cu), or the like.

In this manner, the first wiring patterns 12 and the second wiring patterns 12a are connected mutually via the via holes 14a to 14d formed in the interlayer insulating film 14. The second wiring pattern 12a has a connection pad P that is formed by applying Ni/Au plating onto the Cu wiring. A bump of the electronic parts is bonded to the connection pad P by the ultrasonic flip-chip packaging.

One feature of the wiring substrate of the first embodiment of the present invention resides in that, when the bumps of the electronic parts are bonded to the connection pads P on the wiring substrate 1 by the ultrasonic flip-chip packaging, the connection pad P is prevented from being pressed into the soft interlayer insulating film 14 by the pressure application.

Therefore, in the wiring substrate 1 of the first embodiment, the via holes 14a to 14d in which the via post 11 is filled respectively are positioned under the second wiring pattern 12a formed under or near the connection pad P.

Since the via holes 14a to 14d are arranged under the second wiring pattern 12a just under the connection pad P or within a 200 µm from the connection pad P respectively, the via post 11 in the via holes 14a to 14d function as the strut so that the connection pads P can withstand the pressure or the ultrasonic vibration applied in the ultrasonic flip-chip packaging. As a result, it can be prevented upon the ultrasonic flip-chip packaging that the connection pads P are pressed into the interlayer insulating film 14 and are deformed.

In the example in FIG. 2, out of the via holes 14a to 14d formed in the interlayer insulating film 14, the via holes 14a to 14c depicted by the hatching are the normal via holes constituting a desired circuit, while the via hole 14d depicted by the cross-hatching is arranged as a dummy via hole. That is, in an area indicated as a C portion, since the connection pad P is arranged apart from the via hole 14c arranged under a normal design rule in excess of 200 µm, the dummy via hole 14d is arranged under the connection pad P. An extended pad 12x that is formed by extending partially the first wiring pattern 12 in the C portion is arranged under the dummy via hole 14d and acts as an etching stopper layer upon forming the via hole. In place of the extended pad 12x, a pad that is separated from the first wiring pattern 12 may be formed.

In contrast, in an area indicated as a B portion, since the via hole 14b is arranged in the position within 200 µm from the connection pad P, the normal via hole 14b functions as the strut of the connection pad P and thus no dummy via hole is formed. Also, in an area indicated as an A portion, the normal via hole 14a is arranged just under the connection pad P to function as the strut, there is no necessity to arrange the dummy via hole.

In this case, in the case that the design rule to arrange all the normal via holes within 200 µm from the connection pad P is applied, there is no necessity to form the dummy via hole because the normal via holes function as the struts to support the connection pads P. Otherwise, in the case that the design rule to arrange all the normal via holes beyond 200 μm from the connection pad P is applied, the above-mentioned dummy via hole is formed every connection pad P.

In this manner, the wiring substrate 1 of the present embodiment is constructed and the bumps of the electronic parts are bonded to the connection pads P of the wiring substrate 1 by the ultrasonic flip-chip packaging.

Figure 3:
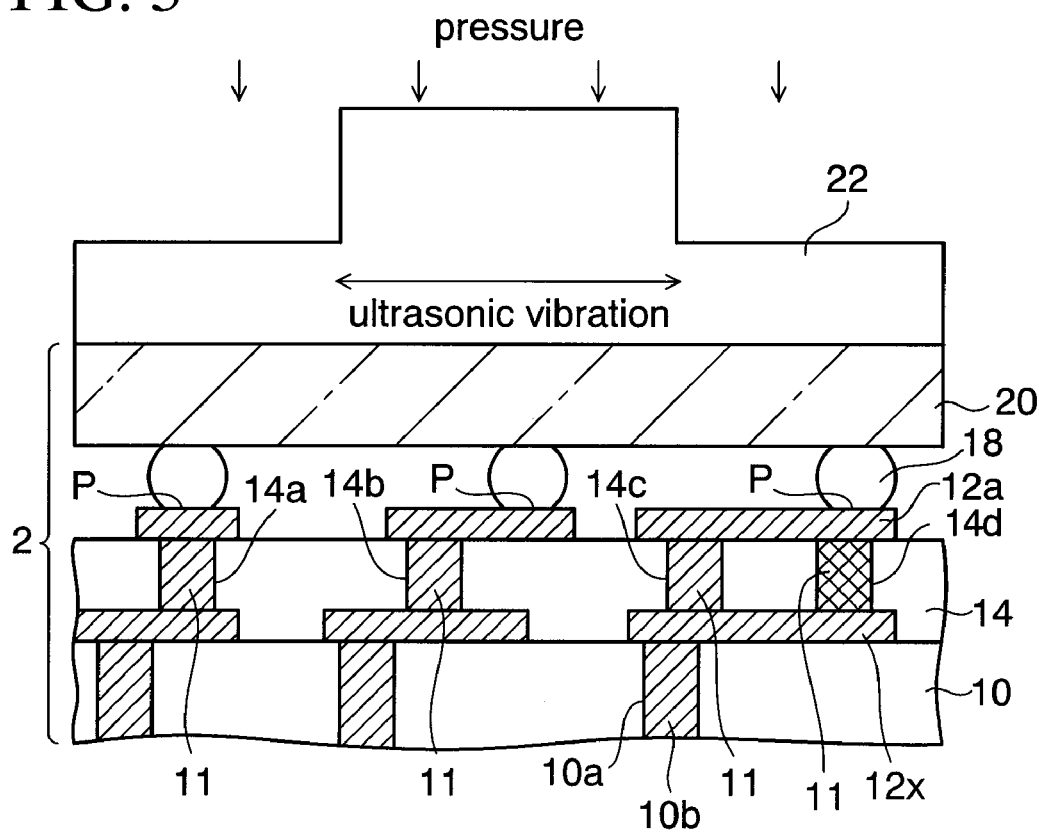
FIG. 3 is a sectional view showing a behavior of packaging the electronic parts on the wiring substrate of the first embodiment of the present invention.

Next, a method of packaging the electronic parts onto the wiring substrate 1 by the ultrasonic flip-chip packaging will be explained hereunder. As shown in FIG. 3, first an electronic parts 20 (semiconductor chip, or the like) having (Au) bumps 18 is prepared. Then, the electronic parts 20 is picked up by an ultrasonic tool 22. Then, the electronic parts 20 is arranged on the wiring substrate 1 in such a manner that the bumps 18 of the electronic parts 20 face to the connection pads P of the wiring substrate 1.

Then, the ultrasonic vibration is applied in parallel with a surface of the wiring substrate 1 while pressurizing the electronic parts 20 to the wiring substrate 1 side. Accordingly, the (Au) bumps 18 of the electronic parts 20 are bonded to the connection pads P (whose uppermost layer is formed of an Au layer) of the wiring substrate 1.

At this time, as described above, since the via holes 14a, 14b, 14d in which the via post 11 is filled to function as the strut respectively are present under the second wiring patterns 12a under or near respective connection pads P of the wiring substrate 1, it can be prevented that the connection pads P eat into the interlayer insulating film 14 owing to the pressure or the ultrasonic vibration applied by the ultrasonic tool 22.

Therefore, the energy of the ultrasonic vibration is not consumed as the energy to cause the connection pads P to eat into the interlayer insulating film 14, and is transmitted as the energy to bond the bumps 18 of the electronic parts 20 and the connection pads P of the wiring substrate 1. As a result, the bumps 18 of the electronic parts 20 and the connection pads P of the wiring substrate 1 can be bonded with good reliability.

Also, the wiring substrate 1 of the present embodiment is convenient from such an aspect that the damage to the electronic parts 20 can be reduced as much as possible when the electronic parts 20 are packaged by the ultrasonic flip-chip packaging.

In this way, as shown in FIG. 3, an electronic parts packaging structure 2 in which the bumps 18 of the electronic parts 20 are bonded to the connection pads P of the wiring substrate 1 respectively can be obtained.

In this case, in the foregoing mode, the mode in which the ultrasonic flip-chip packaging is applied to the Au—Au bonding is exemplified. But the present invention may be applied a variety of metal bondings such as Au—Cu bonding, Au—Al bonding, bonding between tin-silver (Sn—Ag)-based lead(Pd)-free solder and Cu, or the like.

(Second Embodiment)

Figure 4:
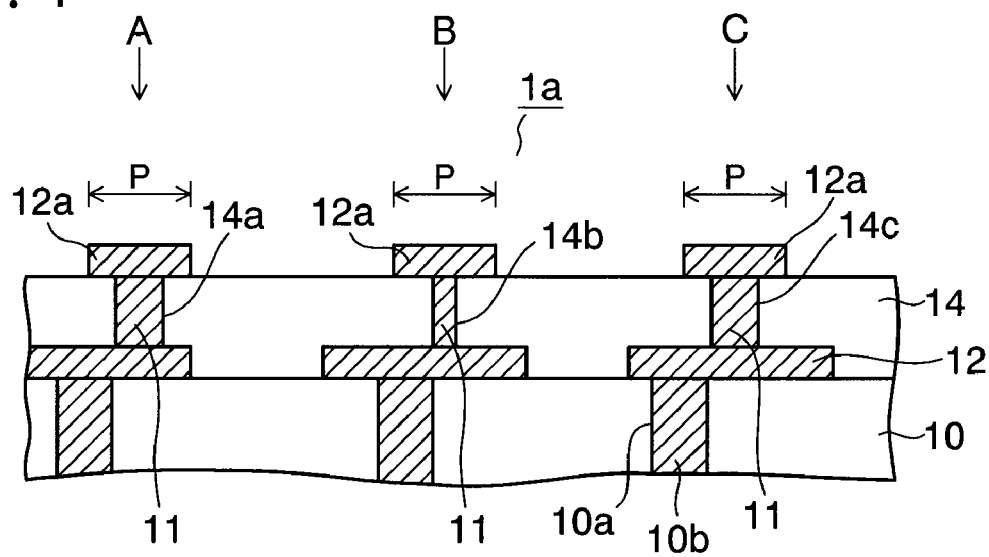
FIG. 4 is a sectional view showing a wiring substrate of a second embodiment of the present invention (a sectional view taken along a I—I line in FIG. 5)
Figure 5:
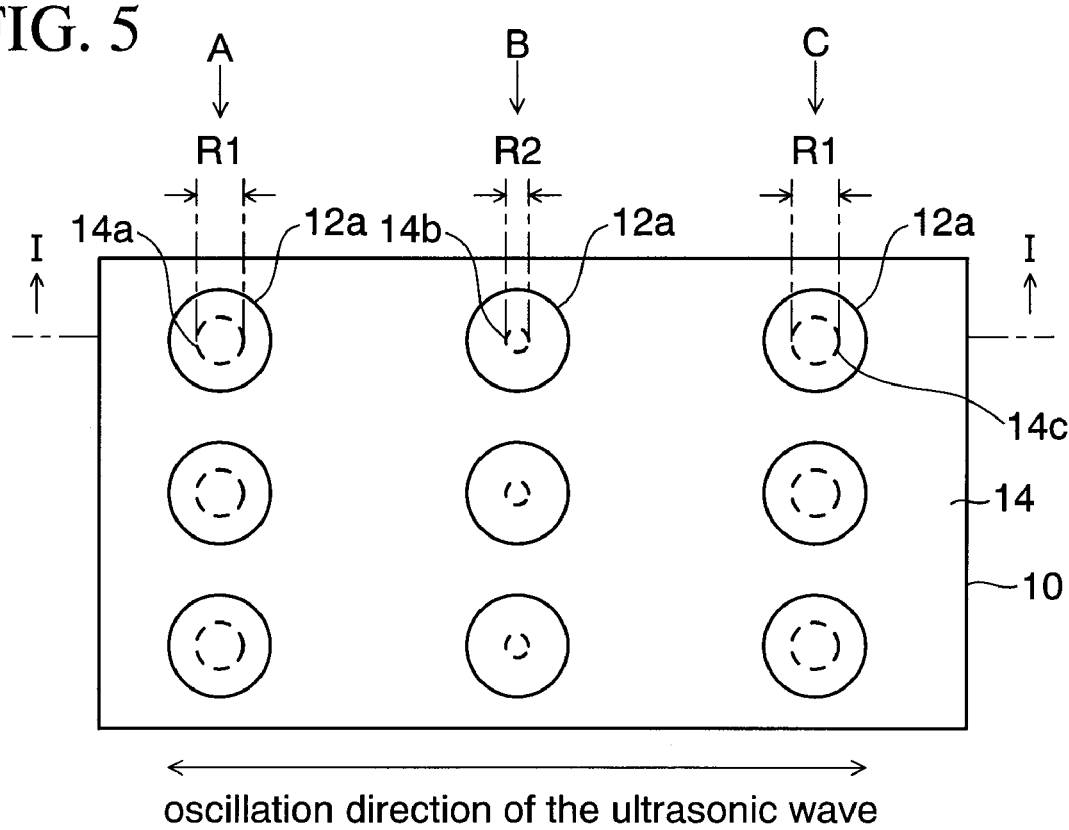
FIG. 5 is a plan view when viewed from the top in FIG. 4.

FIG. 4 is a sectional view showing a wiring substrate of a second embodiment of the present invention (corresponding to a sectional view taken along a I—I line in FIG. 5). FIG. 5 is a plan view when viewed from the top in FIG. 4. As described above, in the ultrasonic flip-chip packaging, the ultrasonic vibration has such a characteristic that its energy is ready to transfer to the center portion of the electronic parts rather than both end portions.

Therefore, the bonding characteristic is varied between the center portion and both end portions of the electronic parts, and thus reliability of the bonding is degraded in some cases.

The second embodiment is such a mode that is created to have the similar advantages as the first embodiment and to overcome the above-mentioned subject. In FIG. 4, the same reference symbols are affixed to the same elements as the first embodiment and their explanation will be omitted herein.

As shown in FIG. 4, in a wiring substrate 1a of the second embodiment, the via holes 14a to 14c into which the via post 11 is filled respectively are arranged in the interlayer insulating film 14 under the connection pads P of the second wiring pattern 12a, based on the similar technical idea to the first embodiment. In the example in FIG. 4, in order to simplify the explanation, a mode in which the via holes 14a to 14c are arranged under the connection pads P respectively is exemplified. In this case, as explained in the first embodiment, such a mode may be employed that contains the portion in which the via hole is formed under the second wiring pattern 12a within 200 μm from the connection pad P. Also, the via holes 14a to 14c may be provided to contain the dummy via hole, and only the normal via holes may be provided as a whole.

Now, attention is paid to diameters of the via holes 14a to 14c. As shown in FIG. 5, a diameter R1 of the via holes 14a, 14c arranged under the connection pads P (the A portion and the C portion), to which the bumps provided to both end portions of the electronic parts are bonded, is set larger than a diameter R2 of the via hole 14b arranged under the connection pad P (the B portion) to which the bump provided to the center portion of the electronic parts is bonded.

That is, although shown schematically in the examples in FIG. 4 and FIG. 5, a plurality of via holes 14a, 14b, 14c, . . . , connected to a plurality of connection pads P of the wiring substrate 1a are arranged such that the diameter of the via hole is set smallest at the center portion and then is increased sequentially or in unit of a predetermined area toward both end side from the center portion along the oscillation direction of the ultrasonic wave applied when the electronic parts is packaged.

In the case that the bumps of the electronic parts are bonded to the connection pads P of the wiring substrate 1a in FIG. 4 and FIG. 5 by the ultrasonic flip-chip packaging, when the oscillation direction of the ultrasonic wave is set in the direction shown in FIG. 5, the ultrasonic vibration tends to transfer largely to the center portion of the electronic parts rather than both end portions. Therefore, since the center portion of the electronic parts is bonded at first and then both end portions of the electronic parts are bonded, disadvantages such as destruction of the bonding in the center portion during when both end portions are bonded, etc. are generated and thus reliability of the bonding is ready to degrade.

However, in the wiring substrate 1a of the present embodiment, as described above, the diameter R1 of the via holes 14a, 14c arranged under the connection pads P at both end portions (the A portion and the C portion) is set larger than the diameter R2 of the via hole 14b arranged under the connection pad P at the center portion (the B portion). Therefore, the connection pads P at both end portions has a larger withstanding force against the pressure or the ultrasonic vibration than the connection pad P at the center portion.

Therefore, the ultrasonic vibration can be transferred sufficiently to both end portions of the electronic parts upon the ultrasonic flip-chip packaging. As a result, unevenness of the energy transfer of the ultrasonic vibration can be improved. In this manner, since the energy of the ultrasonic vibration can be transferred uniformly to the overall electronic parts, the bumps of the electronic parts can be bonded to the connection pads P of the wiring substrate 1a with good reliability as a whole.

As a consequence, yield of production of the electronic parts packaging structure in which the electronic parts are packaged onto the wiring substrate 1a can be improved.

(Third Embodiment)

Figure 6:
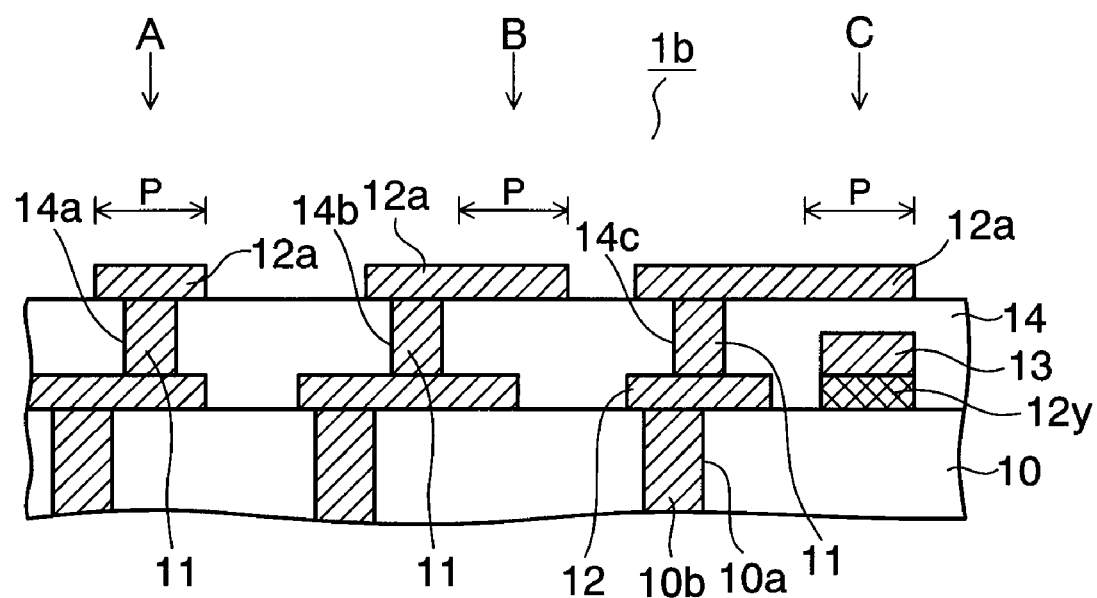
FIG. 6 is a sectional view showing a wiring substrate of a third embodiment of the present invention.

FIG. 6 is a sectional view showing a wiring substrate of a third embodiment of the present invention. In the first embodiment, the mode in which the dummy via hole is formed under the connection pad of the wiring substrate is exemplified. For convenience of the circuit design of the wiring substrate, the case where the dummy via hole cannot be formed under the connection pads is supposed. The third embodiment is provided to consider such case, and such a mode is provided that the dummy via hole is formed not to be connected electrically to the connection pad.

As shown in FIG. 6, in a wiring substrate 1b of the third embodiment, like the first embodiment, first the base substrate 10 having the structure in which a through electrode 10b is filled in the through hole 10a and then the first wiring pattern 12 is connected to the through electrode 10b is prepared. In the third embodiment, such a mode is exemplified that a first wiring pattern 12y (cross-hatched portion in the C portion) connected to other connection pad is arranged under the portion at which the dummy via hole 14d is arranged in the first embodiment. Therefore, if the dummy via hole that is connected electrically to the connection pad P (the C portion) is arranged on the first wiring pattern 12y (the cross-hatched portion in the C portion), the short circuit is caused between the circuits on the wiring substrate 1b.

For this reason, in the present embodiment, a post 13 having a height that is lower than a film thickness of the interlayer insulating film 14 is formed selectively on the first wiring pattern 12y (the cross-hatched portion). For example, the post 13 is made of the same material as the first wiring pattern 12 and is formed by the subtractive process, the semi-additive process, or the like after the first wiring pattern 12 is formed. Alternately, hard insulator such as a silicon oxide film, or the like may be formed as the post 13.

Then, a resin film is pasted on the first wiring pattern 12 and the post 13, and then an interlayer insulating film 14 is formed by heat-treating. At this time, the post 13 is in the state where an upper surface is buried in the interlayer insulated film 14.

Then, the via holes 14a to 14c similar to the first embodiment are formed by processing predetermined portions of the interlayer insulating film 14 on the first wiring pattern 12 by means of the laser, or the like. Then, the second wiring patterns 12a having the connection pads P similar to the first embodiment are formed on the interlayer insulating film 14.

Accordingly, the post 13 is arranged under the connection pad P in the C portion via the interlayer insulating film 14.

Since a top surface of the post 13 is buried in the interlayer insulating film 14 and thus the post 13 is not connected electrically to the connection pad P, there is no possibility that the short circuit is caused between the circuits on the wiring substrate 1b.

When constructed in this manner, substantial hardness of the underlying portion of the connection pad P is increased because the post 13 is harder than the interlayer insulating film 14. Therefore, when the electronic parts are packaged on the wiring substrate 1b by the ultrasonic flip-chip packaging, the intrusion of the connection pad P into the interlayer insulating film 14 can be prevented.

As a result, like the first embodiment, it can be prevented that the connection pads P are pressed into the interlayer insulating film 14 by the pressure or the ultrasonic vibration applied by the ultrasonic flip-chip packaging, and also the electronic parts can be connected to the wiring substrate 1b with good reliability.

The invention claimed is:

1. An electronic parts packaging structure comprising:
   a wiring substrate which has a structure in which a wiring pattern including a plurality of connection pads on an insulating film, and in which a plurality of via posts are filled in via holes are arranged in portions in the insulating film under the connection pads or under the wiring pattern connected to connection pads within 200 μm from the connection pads, the via post functioning as strut to support the connection pads upon a ultrasonic flip-chip packaging; and
   the electronic parts whose bumps are ultrasonic flip-chip packaged to the connection pads;
   wherein, the via holes are arranged in a state that dummy via holes and normal via holes are arranged mixedly, and a normal via holes is arranged separately under the wiring pattern electrically connected to the dummy via hole, in the wiring pattern in which the via post in dummy via holes is used as the struts.

2. The electronic parts packaging structure according to claim 1, wherein the normal via hole is arranged in a position that is away from the connection pad in excess of 200 μm.

3. A wiring substrate according to claim 1, wherein a via post filled in the dummy via hole is formed between an upper surface of the via post and a lower surface of the connection pad or the wiring pattern via the insulating film.

4. A wiring substrate according to claim 1, wherein the wiring substrate has a plurality of connection pads corresponding to a plurality of bumps of the electronic parts, and a plurality of via holes associated with the plurality of connection pads, and a diameter of the via holes formed in portions corresponding to both end portions of the electronic parts is set larger than a diameter of the via hole formed in a portion corresponding to a center portion of the electronic parts, in an oscillation direction of an ultrasonic wave applied when the electronic parts is packaged onto the wiring substrate by the ultrasonic flip-chip packaging.

5. The electronic parts packaging structure according to claim 1, wherein the insulating film on the wiring substrate is made of resin.

6. An electronic parts packaging structure according to claim 1, wherein the bump of the electronic parts is made of gold, and at least a surface layer portion of the connection pad of the wiring substrate is made of gold.

* * * * *